United States Patent
Sharenko

(10) Patent No.: US 11,984,521 B2
(45) Date of Patent: May 14, 2024

(54) COMBINED ENCAPSULANT AND BACKSHEET FOR PHOTOVOLTAIC MODULES

(71) Applicant: GAF Energy LLC, Parsippany, NJ (US)

(72) Inventor: Alex Sharenko, Berkeley, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/181,285

(22) Filed: Mar. 9, 2023

(65) Prior Publication Data
US 2023/0290895 A1    Sep. 14, 2023

Related U.S. Application Data

(60) Provisional application No. 63/318,696, filed on Mar. 10, 2022.

(51) Int. Cl.
*H01L 31/049* (2014.01)
*H01L 31/048* (2014.01)
*H02S 20/23* (2014.01)

(52) U.S. Cl.
CPC ........ *H01L 31/049* (2014.12); *H01L 31/0481* (2013.01); *H02S 20/23* (2014.12)

(58) Field of Classification Search
CPC .............. H01L 31/0203; H01L 31/048; H01L 31/0481; H01L 31/049; Y02E 10/50
See application file for complete search history.

(56) References Cited

U.S. PATENT DOCUMENTS

| 1,981,467 | A | 11/1934 | Radtke |
| 3,156,497 | A | 11/1964 | Lessard |
| 4,258,948 | A | 3/1981 | Hoffmann |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Mayla Gonzalez Ramos
(74) *Attorney, Agent, or Firm* — GREENBERG TRAURIG, LLP

(57) ABSTRACT

A system including at least one photovoltaic module configured to be installed on a roof deck having an underlayment layer. The photovoltaic module includes at least one solar cell having a first side and a second side opposite the first side, an encapsulant layer juxtaposed with the first side of the solar cell, a glass layer juxtaposed with the encapsulant layer, and a encapsulant-backsheet layer juxtaposed with the second side of the solar cell. The encapsulant layer and the encapsulant-backsheet layer encapsulate the at least one solar cell. The system does not include an intervening layer between the encapsulant-backsheet layer and the underlayment layer.

20 Claims, 2 Drawing Sheets

(56) References Cited

U.S. PATENT DOCUMENTS

| | | |
|---|---|---|
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1* | 12/2007 | Sheats ............... H02S 20/23 |
| | | 136/251 |
| 2007/0295386 A1* | 12/2007 | Capps ............... H01L 31/0392 |
| | | 136/251 |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0271774 A1 | 11/2008 | Kalkanoglu et al. |
| 2008/0302030 A1* | 12/2008 | Stancel ............... H01L 31/0521 |
| | | 136/246 |
| 2008/0315061 A1 | 12/2008 | Fath |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |

(56) References Cited

U.S. PATENT DOCUMENTS

| | | |
|---|---|---|
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2010/0019580 A1 | 1/2010 | Croft et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0139224 A1* | 6/2011 | Krajewski ............. H01L 31/048 438/66 |
| 2011/0168238 A1 | 7/2011 | Metin et al. |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0055664 A1* | 3/2013 | Gombarick, Jr. ....... H02S 20/23 52/173.3 |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0254738 A1 | 9/2018 | Yang et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0343886 A1 | 11/2021 | Sharenko et al. |

FOREIGN PATENT DOCUMENTS

| | | |
|---|---|---|
| CN | 202797032 U | 3/2013 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-2019-0000367 A | 1/2019 |
| KR | 10-2253483 B1 | 5/2021 |
| NL | 2026856 81 | 6/2022 |
| WO | 2011/049944 A1 | 4/2011 |
| WO | 2015/133632 A1 | 9/2015 |
| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5KW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

COMBINED ENCAPSULANT AND BACKSHEET FOR PHOTOVOLTAIC MODULES

CROSS-REFERENCE TO RELATED APPLICATION

This application is a Section 111(a) application relating to and claiming the benefit of commonly-owned, U.S. Provisional Patent Application Ser. No. 63/318,696, filed Mar. 10, 2022, entitled "COMBINED ENCAPSULANT AND BACKSHEET FOR PHOTOVOLTAIC MODULES," the contents of each of which are incorporated herein by reference in its entirety.

FIELD OF THE INVENTION

The present invention relates to photovoltaic modules, and, more particularly, combined encapsulants and backsheets for photovoltaic modules.

BACKGROUND OF THE INVENTION

Photovoltaic systems having solar panels are commonly installed on roofing of structures.

SUMMARY OF THE INVENTION

In some embodiments, a system, comprising at least one photovoltaic module installed on a roof deck, wherein the at least one photovoltaic module includes at least one solar cell, wherein the at least one solar cell includes a first side and a second side opposite the first side, an encapsulant layer juxtaposed with the first side of the at least one solar cell, a glass layer juxtaposed with the encapsulant layer, and a encapsulant-backsheet layer juxtaposed with the second side of the at least one solar cell, wherein the encapsulant layer and the encapsulant-backsheet layer encapsulate the at least one solar cell; and an underlayment layer installed on the roof deck, wherein the system does not include an intervening layer between the encapsulant-backsheet layer and the underlayment layer.

In some embodiments, the encapsulant-backsheet layer is composed of a thermoplastic polymer. In some embodiments, the encapsulant-backsheet layer is composed of thermoplastic polyolefin (TPO). In some embodiments, the thermoplastic polyolefin is selected from the group consisting of polyethylene, polypropylene, any copolymer thereof, any homopolymer thereof, any polymer blend thereof, or any combination thereof. In some embodiments, the thermoplastic polyolefin is selected from the group consisting of a copolymer of propylene and ethylene, a blend of propylene and ethylene, a copolymer of ethylene alpha-olefin, a propylene homopolymer, an ethylene homopolymer, a propylene block copolymer, an ethylene block copolymer, a propylene elastomer, an ethylene elastomer, or any combination thereof. In some embodiments, the thermoplastic polymer is selected from the group consisting of a copolymer comprising ethylene and octene, a copolymer comprising ethylene and hexane, a copolymer comprising ethylene and butene, polyethylene, polypropylenes, amorphous polyalpha olefins (APAO), amorphous polyolefins (APO), or any combination thereof.

In some embodiments, a thickness of the encapsulant layer is 0.2 mm to 2 mm. In some embodiments, the glass layer includes a thickness in a range of 2.5 mm to 4 mm. In some embodiments, the encapsulant layer is made from a material selected from the group consisting of polyolefins, ethyl vinyl acetates, ionomers, silicones, poly vinyl butyral, epoxies, polyurethanes, and hybrids of any of same. In some embodiments, the encapsulant layer encapsulates 50% to 99.9% of an exterior surface area of the at least one solar cell. In some embodiments, the encapsulant-backsheet layer encapsulates 50% to 99.9% of an exterior surface area of the at least one solar cell.

In some embodiments, the encapsulant-backsheet layer is composed of a single extruded, two ply material having a first ply and a second ply. In some embodiments, the first ply is thermoplastic polyolefin (TPO). In some embodiments, the second ply is thermoplastic polyolefin (TPO). In some embodiments, the encapsulant-backsheet layer is co-extruded. In some embodiments, the encapsulant-backsheet layer includes a first material and a second material. In some embodiments, the first material is thermoplastic polyolefin (TPO). In some embodiments, the second material is thermoplastic polyolefin (TPO). In some embodiments, the encapsulant-backsheet layer has a thickness of 0.2 mm to 4 mm.

In some embodiments, a photovoltaic module includes at least one solar cell, wherein the at least one solar cell includes a first side and a second side opposite the first side; an encapsulant layer juxtaposed with the first side of the at least one solar cell; a glass layer juxtaposed with the encapsulant layer; and an encapsulant-backsheet layer juxtaposed with the second side of the at least one solar cell, wherein the encapsulant layer and the encapsulant-backsheet layer encapsulate the at least one solar cell, and wherein the at least one photovoltaic module is configured to be installed on a roof deck having an underlayment layer, and wherein the encapsulant-backsheet layer is configured to be juxtaposed with the underlayment layer without any intervening layer between the encapsulant-backsheet layer and the underlayment layer.

DETAILED DESCRIPTION

Figure 1:
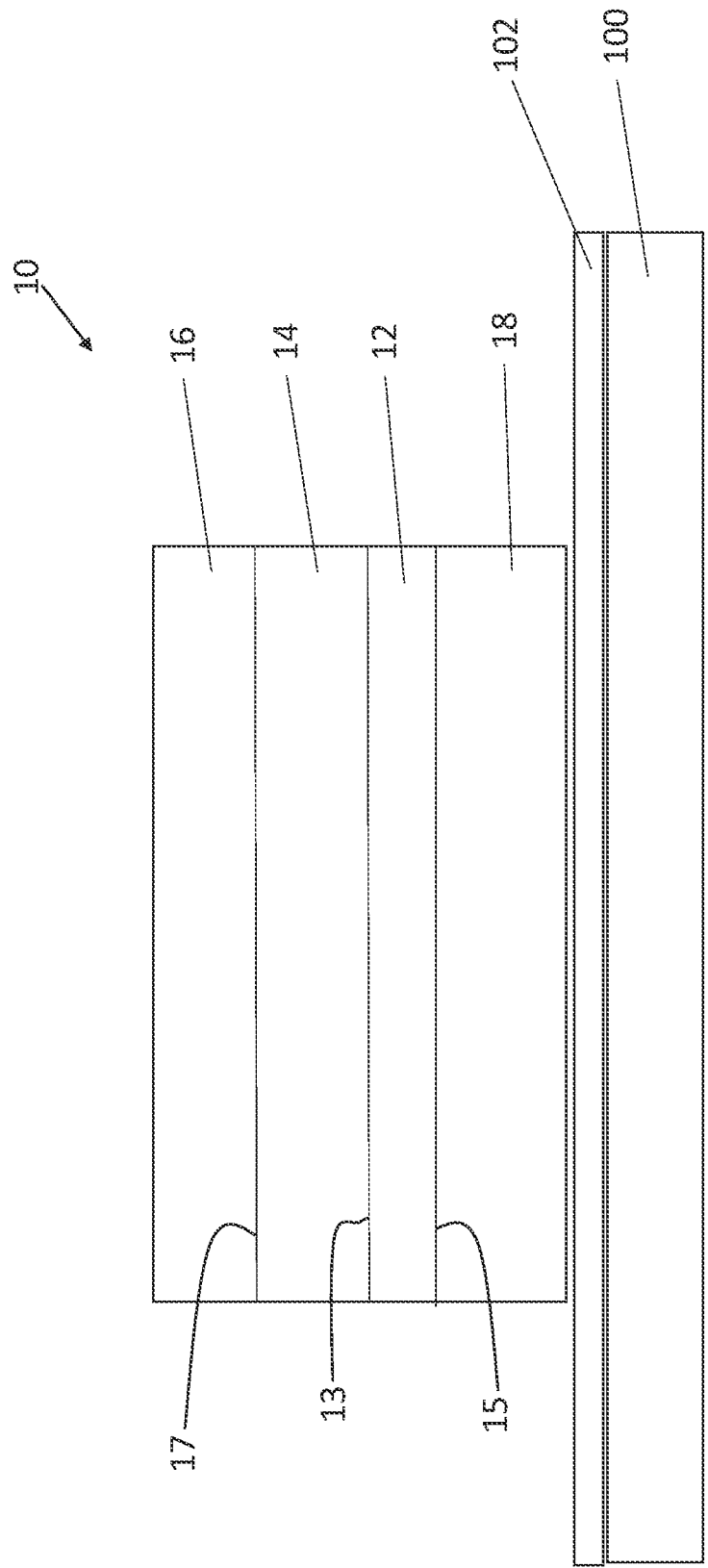
FIG. 1 is a side elevational schematic view of embodiments of a photovoltaic module.

Referring to FIG. 1, in some embodiments, a photovoltaic module 10 includes at least one solar cell 12, an encapsulant layer 14 juxtaposed with a first side 13 of the at least one solar cell 12, and a glass layer 16 juxtaposed with a first side 17 of the encapsulant layer 14. In some embodiments, the at least one solar cell 12 includes a plurality of the solar cells 12. In some embodiments, the encapsulant layer 14 encapsulates the plurality of solar cells 12. As used herein, the terms "encapsulating" and "encapsulates" mean to partially or fully envelope or enclose, and with respect to certain embodiments of the photovoltaic module 10, the plurality of solar cells 12 is fully enveloped by or enclosed within the encapsulant layer 14, or partially enveloped by or enclosed within the encapsulant layer 14. In some embodiments, the encapsulant layer 14 encapsulates 50% to 99.9% of an exterior surface area of the plurality of solar cells 12.

In some embodiments, the encapsulant layer 14 encapsulates 55% to 99.9% of an exterior surface area of the plurality of solar cells 12. In some embodiments, the encapsulant layer 14 encapsulates 60% to 99.9% of an exterior surface area of the plurality of solar cells 12. In some embodiments, the encapsulant layer 14 encapsulates 65% to 99.9% of an exterior surface area of the plurality of solar cells 12. In some embodiments, the encapsulant layer 14 encapsulates 70% to 99.9% of an exterior surface area of the plurality of solar cells 12. In some embodiments, the encapsulant layer 14 encapsulates 75% to 99.9% of an exterior surface area of the plurality of solar cells 12. In some embodiments, the encapsulant layer 14 encapsulates 80% to 99.9% of an exterior surface area of the plurality of solar cells 12. In some embodiments, the encapsulant layer 14 encapsulates 85% to 99.9% of an exterior surface area of the plurality of solar cells 12. In some embodiments, the encapsulant layer 14 encapsulates 90% to 99.9% of an exterior surface area of the plurality of solar cells 12. In some embodiments, the encapsulant layer 14 encapsulates 95% to 99.9% of an exterior surface area of the plurality of solar cells 12.

In some embodiments, the encapsulant layer 14 encapsulates 50% to 95% of an exterior surface area of the plurality of solar cells 12. In some embodiments, the encapsulant layer 14 encapsulates 55% to 95% of an exterior surface area of the plurality of solar cells 12. In some embodiments, the encapsulant layer 14 encapsulates 60% to 95% of an exterior surface area of the plurality of solar cells 12. In some embodiments, the encapsulant layer 14 encapsulates 65% to 95% of an exterior surface area of the plurality of solar cells 12. In some embodiments, the encapsulant layer 14 encapsulates 70% to 95% of an exterior surface area of the plurality of solar cells 12. In some embodiments, the encapsulant layer 14 encapsulates 75% to 95% of an exterior surface area of the plurality of solar cells 12. In some embodiments, the encapsulant layer 14 encapsulates 80% to 95% of an exterior surface area of the plurality of solar cells 12. In some embodiments, the encapsulant layer 14 encapsulates 85% to 95% of an exterior surface area of the plurality of solar cells 12. In some embodiments, the encapsulant layer 14 encapsulates 90% to 95% of an exterior surface area of the plurality of solar cells 12.

In some embodiments, the encapsulant layer 14 encapsulates 50% to 90% of an exterior surface area of the plurality of solar cells 12. In some embodiments, the encapsulant layer 14 encapsulates 55% to 90% of an exterior surface area of the plurality of solar cells 12. In some embodiments, the encapsulant layer 14 encapsulates 60% to 90% of an exterior surface area of the plurality of solar cells 12. In some embodiments, the encapsulant layer 14 encapsulates 65% to 90% of an exterior surface area of the plurality of solar cells 12. In some embodiments, the encapsulant layer 14 encapsulates 70% to 90% of an exterior surface area of the plurality of solar cells 12. In some embodiments, the encapsulant layer 14 encapsulates 75% to 90% of an exterior surface area of the plurality of solar cells 12. In some embodiments, the encapsulant layer 14 encapsulates 80% to 90% of an exterior surface area of the plurality of solar cells 12. In some embodiments, the encapsulant layer 14 encapsulates 85% to 90% of an exterior surface area of the plurality of solar cells 12.

In some embodiments, the encapsulant layer 14 encapsulates 50% to 85% of an exterior surface area of the plurality of solar cells 12. In some embodiments, the encapsulant layer 14 encapsulates 55% to 85% of an exterior surface area of the plurality of solar cells 12. In some embodiments, the encapsulant layer 14 encapsulates 60% to 85% of an exterior surface area of the plurality of solar cells 12. In some embodiments, the encapsulant layer 14 encapsulates 65% to 85% of an exterior surface area of the plurality of solar cells 12. In some embodiments, the encapsulant layer 14 encapsulates 70% to 85% of an exterior surface area of the plurality of solar cells 12. In some embodiments, the encapsulant layer 14 encapsulates 75% to 85% of an exterior surface area of the plurality of solar cells 12. In some embodiments, the encapsulant layer 14 encapsulates 80% to 85% of an exterior surface area of the plurality of solar cells 12.

In some embodiments, the encapsulant layer 14 encapsulates 50% to 80% of an exterior surface area of the plurality of solar cells 12. In some embodiments, the encapsulant layer 14 encapsulates 55% to 80% of an exterior surface area of the plurality of solar cells 12. In some embodiments, the encapsulant layer 14 encapsulates 60% to 80% of an exterior surface area of the plurality of solar cells 12. In some embodiments, the encapsulant layer 14 encapsulates 65% to 80% of an exterior surface area of the plurality of solar cells 12. In some embodiments, the encapsulant layer 14 encapsulates 70% to 80% of an exterior surface area of the plurality of solar cells 12. In some embodiments, the encapsulant layer 14 encapsulates 75% to 80% of an exterior surface area of the plurality of solar cells 12.

In some embodiments, the encapsulant layer 14 encapsulates 50% to 75% of an exterior surface area of the plurality of solar cells 12. In some embodiments, the encapsulant layer 14 encapsulates 55% to 75% of an exterior surface area of the plurality of solar cells 12. In some embodiments, the encapsulant layer 14 encapsulates 60% to 75% of an exterior surface area of the plurality of solar cells 12. In some embodiments, the encapsulant layer 14 encapsulates 65% to 75% of an exterior surface area of the plurality of solar cells 12. In some embodiments, the encapsulant layer 14 encapsulates 70% to 75% of an exterior surface area of the plurality of solar cells 12.

In some embodiments, the encapsulant layer 14 encapsulates 50% to 70% of an exterior surface area of the plurality of solar cells 12. In some embodiments, the encapsulant layer 14 encapsulates 55% to 70% of an exterior surface area of the plurality of solar cells 12. In some embodiments, the encapsulant layer 14 encapsulates 60% to 70% of an exterior surface area of the plurality of solar cells 12. In some embodiments, the encapsulant layer 14 encapsulates 65% to 70% of an exterior surface area of the plurality of solar cells 12.

In some embodiments, the encapsulant layer 14 encapsulates 50% to 65% of an exterior surface area of the plurality of solar cells 12. In some embodiments, the encapsulant layer 14 encapsulates 55% to 65% of an exterior surface area of the plurality of solar cells 12. In some embodiments, the encapsulant layer 14 encapsulates 60% to 65% of an exterior surface area of the plurality of solar cells 12. In some embodiments, the encapsulant layer 14 encapsulates 50% to 60% of an exterior surface area of the plurality of solar cells 12. In some embodiments, the encapsulant layer 14 encapsulates 55% to 60% of an exterior surface area of the plurality of solar cells 12. In some embodiments, the encapsulant layer 14 encapsulates 55% to 60% of an exterior surface area of the plurality of solar cells 12.

In some embodiments, the encapsulant layer 14 encapsulates 50% of an exterior surface area of the plurality of solar cells 12. In some embodiments, the encapsulant layer 14 encapsulates 55% of the exterior surface area of the plurality of solar cells 12. In some embodiments, the encapsulant layer 14 encapsulates 60% of the exterior surface area of the plurality of solar cells 12. In some embodiments, the encapsulant layer 14 encapsulates 65% of the exterior surface area of the plurality of solar cells 12. In some embodiments, the encapsulant layer 14 encapsulates 70% of the exterior surface area of the plurality of solar cells 12. In some embodiments, the encapsulant layer 14 encapsulates 75% of the exterior surface area of the plurality of solar cells 12. In some embodiments, the encapsulant layer 14 encapsulates 80% of the exterior surface area of the plurality of solar cells 12. In some embodiments, the encapsulant layer 14 encapsulates 85% of the exterior surface area of the plurality of solar cells 12. In some embodiments, the encapsulant layer 14 encapsulates 90% of the exterior surface area of the plurality of solar cells 12. In some embodiments, the encapsulant layer 14 encapsulates 95% of the exterior surface area of the plurality of solar cells 12. In some embodiments, the encapsulant layer 14 encapsulates 100% of the exterior surface area of the plurality of solar cells 12.

In some embodiments, the encapsulant layer 14 has a thickness of 0.2 mm to 4 mm. In some embodiments, the encapsulant layer 14 has a thickness of 0.2 mm to 3.5 mm. In some embodiments, the encapsulant layer 14 has a thickness of 0.2 mm to 3 mm. In some embodiments, the encapsulant layer 14 has a thickness of 0.2 mm to 2.5 mm. In some embodiments, the encapsulant layer 14 has a thickness of 0.2 mm to 2 mm. In some embodiments, the encapsulant layer 14 has a thickness of 0.2 mm to 1.5 mm. In some embodiments, the encapsulant layer 14 has a thickness of 0.2 mm to 1 mm. In some embodiments, the encapsulant layer 14 has a thickness of 0.2 mm to 0.5 mm. In some embodiments, the encapsulant layer 14 has a thickness of 0.5 mm to 4 mm. In some embodiments, the encapsulant layer 14 has a thickness of 0.5 mm to 3.5 mm. In some embodiments, the encapsulant layer 14 has a thickness of 0.5 mm to 3 mm. In some embodiments, the encapsulant layer 14 has a thickness of 0.5 mm to 2.5 mm. In some embodiments, the encapsulant layer 14 has a thickness of 0.5 mm to 2 mm. In some embodiments, the encapsulant layer 14 has a thickness of 0.5 mm to 1.5 mm. In some embodiments, the encapsulant layer 14 has a thickness of 0.5 mm to 1 mm.

In some embodiments, the encapsulant layer 14 has a thickness of 1 mm to 4 mm. In some embodiments, the encapsulant layer 14 has a thickness of 1 mm to 3.5 mm. In some embodiments, the encapsulant layer 14 has a thickness of 1 mm to 3 mm. In some embodiments, the encapsulant layer 14 has a thickness of 1 mm to 2.5 mm. In some embodiments, the encapsulant layer 14 has a thickness of 1 mm to 2 mm. In some embodiments, the encapsulant layer 14 has a thickness of 1 mm to 1.5 mm. In some embodiments, the encapsulant layer 14 has a thickness of 1.5 mm to 4 mm. In some embodiments, the encapsulant layer 14 has a thickness of 1.5 mm to 3.5 mm. In some embodiments, the encapsulant layer 14 has a thickness of 1.5 mm to 3 mm. In some embodiments, the encapsulant layer 14 has a thickness of 1.5 mm to 2.5 mm. In some embodiments, the encapsulant layer 14 has a thickness of 1.5 mm to 2 mm.

In some embodiments, the encapsulant layer 14 has a thickness of 2 mm to 4 mm. In some embodiments, the encapsulant layer 14 has a thickness of 2 mm to 3.5 mm. In some embodiments, the encapsulant layer 14 has a thickness of 2 mm to 3 mm. In some embodiments, the encapsulant layer 14 has a thickness of 2 mm to 2.5 mm. In some embodiments, the encapsulant layer 14 has a thickness of 2.5 mm to 4 mm. In some embodiments, the encapsulant layer 14 has a thickness of 2.5 mm to 3.5 mm. In some embodiments, the encapsulant layer 14 has a thickness of 2.5 mm to 3 mm. In some embodiments, the encapsulant layer 14 has a thickness of 3 mm to 4 mm. In some embodiments, the encapsulant layer 14 has a thickness of 3 mm to 3.5 mm. In some embodiments, the encapsulant layer 14 has a thickness of 3.5 mm to 4 mm.

In some embodiments, the encapsulant layer 14 has a thickness of 0.2 mm. In some embodiments, the encapsulant layer 14 has a thickness of 0.5 mm. In some embodiments, the encapsulant layer 14 has a thickness of 1 mm. In some embodiments, the encapsulant layer 14 has a thickness of 1.5 mm. In some embodiments, the encapsulant layer 14 has a thickness of 2 mm. In some embodiments, the encapsulant layer 14 has a thickness of 2.5 mm. In some embodiments, the encapsulant layer 14 has a thickness of 3 mm. In some embodiments, the encapsulant layer 14 has a thickness of 3.5 mm. In some embodiments, the encapsulant layer 14 has a thickness of 4 mm.

In some embodiments, the encapsulant layer 14 may be composed of polyolefins, ethyl vinyl acetates, ionomers, silicones, poly vinyl butyral, epoxies, polyurethanes, or combinations/hybrids thereof. In some embodiments, the encapsulant layer 14 is composed of thermosetting polyolefin. In some embodiments, non-limiting examples of the encapsulant layer 14 are disclosed in U.S. Pat. No. 11,217,715 to Sharenko et al., which is incorporated by reference herein in its entirety. In some embodiments, the glass layer 16 has a thickness of 2.5 mm to 4 mm.

In some embodiments, a encapsulant-backsheet layer 18 is juxtaposed with a second side 15 of the plurality of solar cells 12. In some embodiments, the encapsulant-backsheet layer 18 encapsulates the plurality of solar cells 12. In some embodiments, the encapsulant-backsheet layer 18 encapsulates 50% to 99.9% of the exterior surface area of the plurality of solar cells 12. In some embodiments, the encapsulant-backsheet layer 18 encapsulates the exterior surface area of the plurality of solar cells 12 in the ranges as identified above with respect to the encapsulant layer 14. In some embodiments, the encapsulant layer 14 and the encapsulant-backsheet layer 18 encapsulate the plurality of solar cells 12.

In some embodiments, the encapsulant layer 14 encapsulates 50% to 99.9% of an exterior surface area of the plurality of solar cells 12, and the encapsulant-backsheet layer 18 covers 0.1% to 50% of the exterior surface area of the plurality of solar cells 12. In another embodiment, the encapsulant layer 14 encapsulates 55% to 99.9% of an exterior surface area of the plurality of solar cells 12, and the encapsulant-backsheet layer 18 covers 0.1% to 45% of the exterior surface area of the plurality of solar cells 12. In another embodiment, the encapsulant layer 14 encapsulates 60% to 99.9% of an exterior surface area of the plurality of solar cells 12, and the encapsulant-backsheet layer 18 covers 0.1% to 40% of the exterior surface area of the plurality of solar cells 12. In another embodiment, the encapsulant layer 14 encapsulates 65% to 99.9% of an exterior surface area of the plurality of solar cells 12, and the encapsulant-backsheet layer 18 covers 0.1% to 35% of the exterior surface area of the plurality of solar cells 12. In another embodiment, the encapsulant layer 14 encapsulates 70% to 99.9% of an exterior surface area of the plurality of solar cells 12, and the encapsulant-backsheet layer 18 covers 0.1% to 30% of the exterior surface area of the plurality of solar cells 12. In another embodiment, the encapsulant layer 14 encapsulates 75% to 99.9% of an exterior surface area of the plurality of solar cells 12, and the encapsulant-backsheet layer 18 covers 0.1% to 25% of the exterior surface area of the plurality of solar cells 12. In another embodiment, the encapsulant layer 14 encapsulates 80% to 99.9% of an exterior surface area of the plurality of solar cells 12, and the encapsulant-backsheet layer 18 covers 0.1% to 20% of the exterior surface area of the plurality of solar cells 12. In another embodiment, the encapsulant layer 14 encapsulates 85% to 99.9% of an exterior surface area of the plurality of solar cells 12, and the encapsulant-backsheet layer 18 covers 0.1% to 15% of the exterior surface area of the plurality of solar cells 12. In another embodiment, the encapsulant layer 14 encapsulates 90% to 99.9% of an exterior surface area of the plurality of solar cells 12, and the encapsulant-backsheet layer 18 covers 0.1% to 10% of the exterior surface area of the plurality of solar cells 12. In another embodiment, the encapsulant layer 14 encapsulates 95% to 99.9% of an exterior surface area of the plurality of solar cells 12, and the encapsulant-backsheet layer 18 covers 0.1% to 5% of the exterior surface area of the plurality of solar cells 12.

In some embodiments, the encapsulant layer 14 encapsulates 50% to 95% of an exterior surface area of the plurality of solar cells 12, and the encapsulant-backsheet layer 18 covers 5% to 50% of the exterior surface area of the plurality of solar cells 12. In another embodiment, the encapsulant layer 14 encapsulates 55% to 95% of an exterior surface area of the plurality of solar cells 12, and the encapsulant-backsheet layer 18 covers 5% to 45% of the exterior surface area of the plurality of solar cells 12. In another embodiment, the encapsulant layer 14 encapsulates 60% to 95% of an exterior surface area of the plurality of solar cells 12, and the encapsulant-backsheet layer 18 covers 5% to 40% of the exterior surface area of the plurality of solar cells 12. In another embodiment, the encapsulant layer 14 encapsulates 65% to 95% of an exterior surface area of the plurality of solar cells 12, and the encapsulant-backsheet layer 18 covers 5% to 35% of the exterior surface area of the plurality of solar cells 12. In another embodiment, the encapsulant layer 14 encapsulates 70% to 95% of an exterior surface area of the plurality of solar cells 12, and the encapsulant-backsheet layer 18 covers 5% to 30% of the exterior surface area of the plurality of solar cells 12. In another embodiment, the encapsulant layer 14 encapsulates 75% to 95% of an exterior surface area of the plurality of solar cells 12, and the encapsulant-backsheet layer 18 covers 5% to 25% of the exterior surface area of the plurality of solar cells 12. In another embodiment, the encapsulant layer 14 encapsulates 80% to 95% of an exterior surface area of the plurality of solar cells 12, and the encapsulant-backsheet layer 18 covers 5% to 20% of the exterior surface area of the plurality of solar cells 12. In another embodiment, the encapsulant layer 14 encapsulates 85% to 95% of an exterior surface area of the plurality of solar cells 12, and the encapsulant-backsheet layer 18 covers 5% to 15% of the exterior surface area of the plurality of solar cells 12. In another embodiment, the encapsulant layer 14 encapsulates 90% to 95% of an exterior surface area of the plurality of solar cells 12, and the encapsulant-backsheet layer 18 covers 5% to 10% of the exterior surface area of the plurality of solar cells 12.

In another embodiment, the encapsulant layer 14 encapsulates 50% to 90% of an exterior surface area of the plurality of solar cells 12, and the encapsulant-backsheet layer 18 covers 10% to 50% of the exterior surface area of the plurality of solar cells 12. In another embodiment, the encapsulant layer 14 encapsulates 55% to 90% of an exterior surface area of the plurality of solar cells 12, and the encapsulant-backsheet layer 18 covers 10% to 45% of the exterior surface area of the plurality of solar cells 12. In another embodiment, the encapsulant layer 14 encapsulates 60% to 90% of an exterior surface area of the plurality of solar cells 12, and the encapsulant-backsheet layer 18 covers 10% to 40% of the exterior surface area of the plurality of solar cells 12. In another embodiment, the encapsulant layer 14 encapsulates 65% to 90% of an exterior surface area of the plurality of solar cells 12, and the encapsulant-backsheet layer 18 covers 10% to 35% of the exterior surface area of the plurality of solar cells 12. In another embodiment, the encapsulant layer 14 encapsulates 70% to 90% of an exterior surface area of the plurality of solar cells 12, and the encapsulant-backsheet layer 18 covers 10% to 30% of the exterior surface area of the plurality of solar cells 12. In another embodiment, the encapsulant layer 14 encapsulates 75% to 90% of an exterior surface area of the plurality of solar cells 12, and the encapsulant-backsheet layer 18 covers 10% to 25% of the exterior surface area of the plurality of solar cells 12. In another embodiment, the encapsulant layer 14 encapsulates 80% to 90% of an exterior surface area of the plurality of solar cells 12, and the encapsulant-backsheet layer 18 covers 10% to 20% of the exterior surface area of the plurality of solar cells 12. In another embodiment, the encapsulant layer 14 encapsulates 85% to 90% of an exterior surface area of the plurality of solar cells 12, and the encapsulant-backsheet layer 18 covers 10% to 15% of the exterior surface area of the plurality of solar cells 12.

In another embodiment, the encapsulant layer 14 encapsulates 50% to 85% of an exterior surface area of the plurality of solar cells 12, and the encapsulant-backsheet layer 18 covers 15% to 50% of the exterior surface area of the plurality of solar cells 12. In another embodiment, the encapsulant layer 14 encapsulates 55% to 85% of an exterior surface area of the plurality of solar cells 12, and the encapsulant-backsheet layer 18 covers 15% to 45% of the exterior surface area of the plurality of solar cells 12. In another embodiment, the encapsulant layer 14 encapsulates 60% to 85% of an exterior surface area of the plurality of solar cells 12, and the encapsulant-backsheet layer 18 covers 15% to 40% of the exterior surface area of the plurality of solar cells 12. In another embodiment, the encapsulant layer 14 encapsulates 65% to 85% of an exterior surface area of the plurality of solar cells 12, and the encapsulant-backsheet layer 18 covers 15% to 35% of the exterior surface area of the plurality of solar cells 12. In another embodiment, the encapsulant layer 14 encapsulates 70% to 85% of an exterior surface area of the plurality of solar cells 12, and the encapsulant-backsheet layer 18 covers 15% to 30% of the exterior surface area of the plurality of solar cells 12. In another embodiment, the encapsulant layer 14 encapsulates 75% to 85% of an exterior surface area of the plurality of solar cells 12, and the encapsulant-backsheet layer 18 covers 15% to 25% of the exterior surface area of the plurality of solar cells 12. In another embodiment, the encapsulant layer 14 encapsulates 80% to 85% of an exterior surface area of the plurality of solar cells 12, and the encapsulant-backsheet layer 18 covers 15% to 20% of the exterior surface area of the plurality of solar cells 12.

In another embodiment, the encapsulant layer 14 encapsulates 50% to 80% of an exterior surface area of the plurality of solar cells 12, and the encapsulant-backsheet layer 18 covers 20% to 50% of the exterior surface area of the plurality of solar cells 12. In another embodiment, the encapsulant layer 14 encapsulates 55% to 80% of an exterior surface area of the plurality of solar cells 12, and the encapsulant-backsheet layer 18 covers 20% to 45% of the exterior surface area of the plurality of solar cells 12. In another embodiment, the encapsulant layer 14 encapsulates 60% to 80% of an exterior surface area of the plurality of solar cells 12, and the encapsulant-backsheet layer 18 covers 20% to 40% of the exterior surface area of the plurality of solar cells 12. In another embodiment, the encapsulant layer 14 encapsulates 65% to 80% of an exterior surface area of the plurality of solar cells 12, and the encapsulant-backsheet layer 18 covers 20% to 35% of the exterior surface area of the plurality of solar cells 12. In another embodiment, the encapsulant layer 14 encapsulates 70% to 80% of an exterior surface area of the plurality of solar cells 12, and the encapsulant-backsheet layer 18 covers 20% to 30% of the exterior surface area of the plurality of solar cells 12. In another embodiment, the encapsulant layer 14 encapsulates 75% to 80% of an exterior surface area of the plurality of solar cells 12, and the encapsulant-backsheet layer 18 covers 20% to 25% of the exterior surface area of the plurality of solar cells 12.

In another embodiment, the encapsulant layer 14 encapsulates 50% to 75% of an exterior surface area of the plurality of solar cells 12, and the encapsulant-backsheet layer 18 covers 25% to 50% of the exterior surface area of the plurality of solar cells 12. In another embodiment, the encapsulant layer 14 encapsulates 55% to 75% of an exterior surface area of the plurality of solar cells 12, and the encapsulant-backsheet layer 18 covers 25% to 45% of the exterior surface area of the plurality of solar cells 12. In another embodiment, the encapsulant layer 14 encapsulates 60% to 75% of an exterior surface area of the plurality of solar cells 12, and the encapsulant-backsheet layer 18 covers 25% to 40% of the exterior surface area of the plurality of solar cells 12. In another embodiment, the encapsulant layer 14 encapsulates 65% to 75% of an exterior surface area of the plurality of solar cells 12, and the encapsulant-backsheet layer 18 covers 25% to 35% of the exterior surface area of the plurality of solar cells 12. In another embodiment, the encapsulant layer 14 encapsulates 70% to 75% of an exterior surface area of the plurality of solar cells 12, and the encapsulant-backsheet layer 18 covers 25% to 30% of the exterior surface area of the plurality of solar cells 12.

In another embodiment, the encapsulant layer 14 encapsulates 50% to 70% of an exterior surface area of the plurality of solar cells 12, and the encapsulant-backsheet layer 18 covers 30% to 50% of the exterior surface area of the plurality of solar cells 12. In another embodiment, the encapsulant layer 14 encapsulates 55% to 70% of an exterior surface area of the plurality of solar cells 12, and the encapsulant-backsheet layer 18 covers 30% to 45% of the exterior surface area of the plurality of solar cells 12. In another embodiment, the encapsulant layer 14 encapsulates 60% to 70% of an exterior surface area of the plurality of solar cells 12, and the encapsulant-backsheet layer 18 covers 30% to 40% of the exterior surface area of the plurality of solar cells 12. In another embodiment, the encapsulant layer 14 encapsulates 65% to 70% of an exterior surface area of the plurality of solar cells 12, and the encapsulant-backsheet layer 18 covers 30% to 35% of the exterior surface area of the plurality of solar cells 12.

In another embodiment, the encapsulant layer 14 encapsulates 50% to 65% of an exterior surface area of the plurality of solar cells 12, and the encapsulant-backsheet layer 18 covers 35% to 50% of the exterior surface area of the plurality of solar cells 12. In another embodiment, the encapsulant layer 14 encapsulates 55% to 65% of an exterior surface area of the plurality of solar cells 12, and the encapsulant-backsheet layer 18 covers 35% to 45% of the exterior surface area of the plurality of solar cells 12. In another embodiment, the encapsulant layer 14 encapsulates 60% to 65% of an exterior surface area of the plurality of solar cells 12, and the encapsulant-backsheet layer 18 covers 35% to 40% of the exterior surface area of the plurality of solar cells 12. In another embodiment, the encapsulant layer 14 encapsulates 50% to 60% of an exterior surface area of the plurality of solar cells 12, and the encapsulant-backsheet layer 18 covers 40% to 50% of the exterior surface area of the plurality of solar cells 12. In another embodiment, the encapsulant layer 14 encapsulates 55% to 60% of an exterior surface area of the plurality of solar cells 12, and the encapsulant-backsheet layer 18 covers 40% to 45% of the exterior surface area of the plurality of solar cells 12. In another embodiment, the encapsulant layer 14 encapsulates 50% to 55% of an exterior surface area of the plurality of solar cells 12, and the encapsulant-backsheet layer 18 covers 45% to 50% of the exterior surface area of the plurality of solar cells 12.

In some embodiments, the encapsulant layer 14 encapsulates 50% of an exterior surface area of the plurality of solar cells 12 and the encapsulant-backsheet layer 18 covers 50% of the exterior surface area of the plurality of solar cells 12. In another embodiment, the encapsulant layer 14 encapsulates 55% of the exterior surface area of the plurality of solar cells 12 and the encapsulant-backsheet layer 18 covers 45% of the exterior surface area of the plurality of solar cells 12. In another embodiment, the encapsulant layer 14 encapsulates 60% of the exterior surface area of the plurality of solar cells 12 and the encapsulant-backsheet layer 18 covers 40% of the exterior surface area of the plurality of solar cells 12. In another embodiment, the encapsulant layer 14 encapsulates 65% of the exterior surface area of the plurality of solar cells 12 and the encapsulant-backsheet layer 18 covers 35% of the exterior surface area of the plurality of solar cells 12. In another embodiment, the encapsulant layer 14 encapsulates 70% of the exterior surface area of the plurality of solar cells 12 and the encapsulant-backsheet layer 18 covers 30% of the exterior surface area of the plurality of solar cells 12. In another embodiment, the encapsulant layer 14 encapsulates 75% of the exterior surface area of the plurality of solar cells 12 and the encapsulant-backsheet layer 18 covers 25% of the exterior surface area of the plurality of solar cells 12. In another embodiment, the encapsulant layer 14 encapsulates 80% of the exterior surface area of the plurality of solar cells 12 and the encapsulant-backsheet layer 18 covers 20% of the exterior surface area of the plurality of solar cells 12. In another embodiment, the encapsulant layer 14 encapsulates 85% of the exterior surface area of the plurality of solar cells 12 and the encapsulant-backsheet layer 18 covers 15% of the exterior surface area of the plurality of solar cells 12. In another embodiment, the encapsulant layer 14 encapsulates 90% of the exterior surface area of the plurality of solar cells 12 and the encapsulant-backsheet layer 18 covers 10% of the exterior surface area of the plurality of solar cells 12. In another embodiment, the encapsulant layer 14 encapsulates 95% of the exterior surface area of the plurality of solar cells 12 and the encapsulant-backsheet layer 18 covers 5% of the exterior surface area of the plurality of solar cells 12. In another embodiment, the encapsulant layer 14 encapsulates 100% of the exterior surface area of the plurality of solar cells 12.

In some embodiments, the encapsulant-backsheet layer 18 comprises one or more thermoplastic polymers. In some embodiments, the thermoplastic polymer includes a polyolefin. In some embodiments, the thermoplastic polymer comprises a thermoplastic polyolefin (TPO). In some embodiments, the thermoplastic polyolefin comprises at least one of polyethylene, polypropylene, any copolymer thereof, any homopolymer thereof, any polymer blend thereof, or any combination thereof. In some embodiments, the thermoplastic polyolefin comprises at least one of a copolymer of propylene and ethylene, a blend of propylene and ethylene, a copolymer of ethylene alpha-olefin, a propylene homopolymer, an ethylene homopolymer, a propylene block copolymer, an ethylene block copolymer, a propylene elastomer, an ethylene elastomer, or any combination thereof. In some embodiments, the thermoplastic polymer comprises at least one of a copolymer comprising ethylene and octene, a copolymer comprising ethylene and hexane, a copolymer comprising ethylene and butene, polyethylene (including raw and/or recycled low density polyethylene (LDPE)), linear low density polyethylene (LLDPE), high density polyethylene (HDPE)), polypropylenes (e.g., isotactic polypropylene (IPP) and/or atactic polypropylene (APP/IPP)), amorphous polyalpha olefins (APAO), amorphous polyolefins (APO), or any combination thereof. Such thermoplastic polymers can include, for example, at least one of Vistamaxx® 6102, Vistamaxx® 8880, both of which are polypropylenes (e.g., isotactic polypropylene (IPP)) that are available from ExxonMobil, Irving, Tex.; Elvaloy®, which is a terpolymer that is available from Dow/DuPont, Wilmington, Del.; Fusabond®, which is a chemically modified ethylene acrylate copolymer and/or a modified polyethylene, that is available from Dow/DuPont, Wilmington, Del.; RT2304, which is an amorphous polyalpha olefin (APAO) that is available from Rextac APAO Polymers LLC, Odessa, Tex.; Eastoflex® P1023, which is an amorphous polyolefin (APO) that comprises a propylene homopolymer, and is available from Eastman Chemical Company, Kingsport, Tenn.; Eastoflex® E1060, which is an amorphous polyolefin (APO) that comprises a copolymer of propylene and ethylene, and is available from Eastman Chemical Company, Kingsport, Tenn.; Eastoflex® M1025, which is an amorphous polyolefin (APO) that comprises a blend of propylene homopolymer and copolymers of propylene and ethylene, and is available from Eastman Chemical Company, Kingsport, Tenn.; Engage® 7487, which is a polyolefin elastomer (POE) that is available from Dow Inc., Midland, Mich., or any combination thereof. In some embodiments, the encapsulant-backsheet layer 18 includes a flame retardant additive. In some embodiments, the flame retardant additive may be clays, nanoclays, silicas, carbon black, metal hydroxides such as aluminum hydroxide, metal foils, graphite, and combinations thereof.

Figure 2:
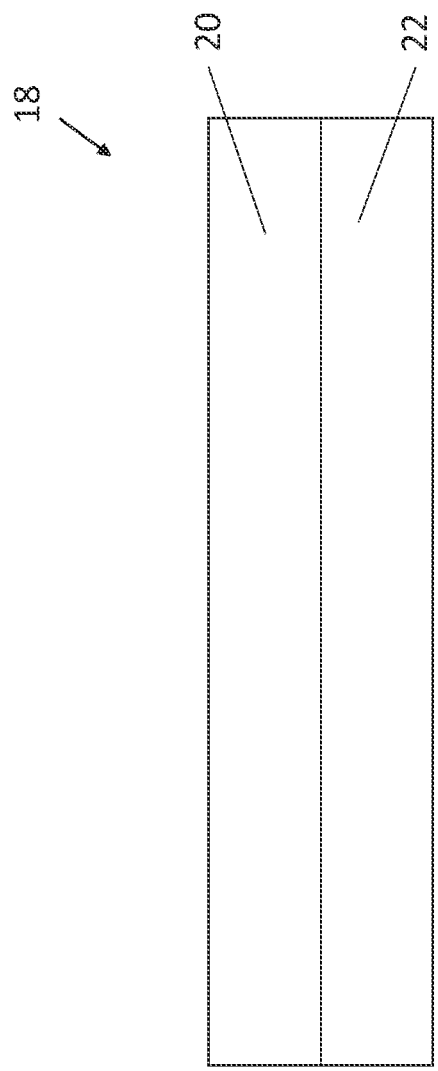
FIG. 2 is a side elevational schematic view of embodiments of a encapsulant-backsheet layer.

Referring to FIG. 2, in some embodiments, the encapsulant-backsheet layer 18 is composed of a single extruded, two ply material. In some embodiments, the encapsulant-backsheet layer 18 includes a first ply 20 and a second ply 22. In some embodiments, the first ply 20 is thermoplastic polyolefin (TPO). In some embodiments, the second ply 22 is thermoplastic polyolefin (TPO). In some embodiments, the encapsulant-backsheet layer 18 is co-extruded. In some embodiments, the co-extruded encapsulant-backsheet layer 18 includes a first material and a second material. In some embodiments, the first material is any one or more of the polymers identified above with respect to the encapsulant-backsheet layer 18. In some embodiments, the second material is any one or more of the polymers identified above with respect to the encapsulant-backsheet layer 18.

In some embodiments, the encapsulant-backsheet layer 18 has a thickness of 0.2 mm to 4 mm. In some embodiments, the encapsulant-backsheet layer 18 has a thickness of 0.2 mm to 3.5 mm. In some embodiments, the encapsulant-backsheet layer 18 has a thickness of 0.2 mm to 3 mm. In some embodiments, the encapsulant-backsheet layer 18 has a thickness of 0.2 mm to 2.5 mm. In some embodiments, the encapsulant-backsheet layer 18 has a thickness of 0.2 mm to 2 mm. In some embodiments, the encapsulant-backsheet layer 18 has a thickness of 0.2 mm to 1.5 mm. In some embodiments, the encapsulant-backsheet layer 18 has a thickness of 0.2 mm to 1 mm. In some embodiments, the encapsulant-backsheet layer 18 has a thickness of 0.2 mm to 0.5 mm. In some embodiments, the encapsulant-backsheet layer 18 has a thickness of 0.5 mm to 4 mm. In some embodiments, the encapsulant-backsheet layer 18 has a thickness of 0.5 mm to 3.5 mm. In some embodiments, the encapsulant-backsheet layer 18 has a thickness of 0.5 mm to 3 mm. In some embodiments, the encapsulant-backsheet layer 18 has a thickness of 0.5 mm to 2.5 mm. In some embodiments, the encapsulant-backsheet layer 18 has a thickness of 0.5 mm to 2 mm. In some embodiments, the encapsulant-backsheet layer 18 has a thickness of 0.5 mm to 1.5 mm. In some embodiments, the encapsulant-backsheet layer 18 has a thickness of 0.5 mm to 1 mm.

In some embodiments, the encapsulant-backsheet layer 18 has a thickness of 1 mm to 4 mm. In some embodiments, the encapsulant-backsheet layer 18 has a thickness of 1 mm to 3.5 mm. In some embodiments, the encapsulant-backsheet layer 18 has a thickness of 1 mm to 3 mm. In some embodiments, the encapsulant-backsheet layer 18 has a thickness of 1 mm to 2.5 mm. In some embodiments, the encapsulant-backsheet layer 18 has a thickness of 1 mm to 2 mm. In some embodiments, the encapsulant-backsheet layer 18 has a thickness of 1 mm to 1.5 mm. In some embodiments, the encapsulant-backsheet layer 18 has a thickness of 1.5 mm to 4 mm. In some embodiments, the encapsulant-backsheet layer 18 has a thickness of 1.5 mm to 3.5 mm. In some embodiments, the encapsulant-backsheet layer 18 has a thickness of 1.5 mm to 3 mm. In some embodiments, the encapsulant-backsheet layer 18 has a thickness of 1.5 mm to 2.5 mm. In some embodiments, the encapsulant-backsheet layer 18 has a thickness of 1.5 mm to 2 mm.

In some embodiments, the encapsulant-backsheet layer 18 has a thickness of 2 mm to 4 mm. In some embodiments, the encapsulant-backsheet layer 18 has a thickness of 2 mm to 3.5 mm. In some embodiments, the encapsulant-backsheet layer 18 has a thickness of 2 mm to 3 mm. In some embodiments, the encapsulant-backsheet layer 18 has a thickness of 2 mm to 2.5 mm. In some embodiments, the encapsulant-backsheet layer 18 has a thickness of 2.5 mm to 4 mm. In some embodiments, the encapsulant-backsheet layer 18 has a thickness of 2.5 mm to 3.5 mm. In some embodiments, the encapsulant-backsheet layer 18 has a thickness of 2.5 mm to 3 mm. In some embodiments, the encapsulant-backsheet layer 18 has a thickness of 3 mm to 4 mm. In some embodiments, the encapsulant-backsheet layer 18 has a thickness of 3 mm to 3.5 mm. In some embodiments, the encapsulant-backsheet layer 18 has a thickness of 3.5 mm to 4 mm.

In some embodiments, the encapsulant-backsheet layer 18 has a thickness of 0.2 mm. In some embodiments, the encapsulant-backsheet layer 18 has a thickness of 0.5 mm. In some embodiments, the encapsulant-backsheet layer 18 has a thickness of 1 mm. In some embodiments, the encapsulant-backsheet layer 18 has a thickness of 1.5 mm. In some embodiments, the encapsulant-backsheet layer 18 has a thickness of 2 mm. In some embodiments, the encapsulant-backsheet layer 18 has a thickness of 2.5 mm. In some embodiments, the encapsulant-backsheet layer 18 has a thickness of 3 mm. In some embodiments, the encapsulant-backsheet layer 18 has a thickness of 3.5 mm. In some embodiments, the encapsulant-backsheet layer 18 has a thickness of 4 mm.

In some embodiments, the photovoltaic module 10 is installed on a roof deck 100. In some embodiments, there is no intervening layer between the roof deck 100 and the encapsulant-backsheet layer 18 of the photovoltaic module 10. In some embodiments, the encapsulant-backsheet layer 18 is attached to the roof deck 100 by an adhesive. In some embodiments, the adhesive is a butyl adhesive. In some embodiments, a fleece layer and an adhesive are utilized between the encapsulant-backsheet layer 18 of the roof deck 100 to secure the bonding thereof. In some embodiments, the encapsulant-backsheet layer 18 is attached to the roof deck 100 by plasma treatment. In some embodiments, the encapsulant-backsheet layer 18 is attached to the roof deck 100 by a combination of any of the adhesive, the fleece layer and/or plasma treatment. In some embodiments, an underlayment layer 102 is installed on the roof deck 100. In some embodiments, there is no intervening layer between the underlayment layer 102 and the encapsulant-backsheet layer 18 of the photovoltaic module 10.

In some embodiments, the photovoltaic module 10 is adapted to be a component of a photovoltaic system that includes a fire resistance that conforms to standards under UL 790/ASTM E 108 test standards. In some embodiments, the photovoltaic module 10 includes a Class A rating when tested in accordance with UL 790/ASTM E 108.

As used herein, the term "fire-retardant" means a material having a V-0, V-1, V-2, 5VA, or 5VB rating when tested in accordance with UL 94. In some embodiments, the encapsulant-backsheet layer 18 includes a V-0 rating when tested in accordance with UL 94. In some embodiments, the encapsulant-backsheet layer 18 includes a V-1 rating when tested in accordance with UL 94. In some embodiments, the encapsulant-backsheet layer 18 includes a V-2 rating when tested in accordance with UL 94. In some embodiments, the encapsulant-backsheet layer 18 includes a 5VA rating when tested in accordance with UL 94. In some embodiments, the encapsulant-backsheet layer 18 includes a 5VB rating when tested in accordance with UL 94.

As used herein, the term "moisture resistant" means having a water transmission rate of less than or equal to 0.05 U.S. perm, as measured by ASTM E 96, Procedure B-Standard Test Methods for Water Vapor Transmission of Materials. In some embodiments, the encapsulant-backsheet layer 18 includes a water vapor transmission rate in a range between 0.01 perm and 0.05 U.S. perm. In some embodiments, the encapsulant-backsheet layer 18 includes a water vapor transmission rate in a range between 0.01 perm and 0.04 U.S. perm. In some embodiments, the encapsulant-backsheet layer 18 includes a water vapor transmission rate in a range between 0.01 perm and 0.03 U.S. perm. In some embodiments, the encapsulant-backsheet layer 18 includes a water vapor transmission rate in a range between 0.01 perm and 0.02 U.S. perm. In some embodiments, the encapsulant-backsheet layer 18 includes a water vapor transmission rate in a range between 0.02 perm and 0.05 U.S. perm. In some embodiments, the encapsulant-backsheet layer 18 includes a water vapor transmission rate in a range between 0.02 perm and 0.04 U.S. perm. In some embodiments, the encapsulant-backsheet layer 18 includes a water vapor transmission rate in a range between 0.02 perm and 0.03 U.S. perm. In some embodiments, the encapsulant-backsheet layer 18 includes a water vapor transmission rate in a range between 0.03 perm and 0.05 U.S. perm. In some embodiments, the encapsulant-backsheet layer 18 includes a water vapor transmission rate in a range between 0.03 perm and 0.04 U.S. perm. In some embodiments, the encapsulant-backsheet layer 18 includes a water vapor transmission rate in a range between 0.04 perm and 0.05 U.S. perm.

In some embodiments, the encapsulant-backsheet layer 18 includes a water vapor transmission rate of 0.05 U.S. perm. In some embodiments, the encapsulant-backsheet layer 18 includes a water vapor transmission rate of 0.04 U.S. perm. In some embodiments, the encapsulant-backsheet layer 18 includes a water vapor transmission rate of 0.03 U.S. perm. In some embodiments, the encapsulant-backsheet layer 18 includes a water vapor transmission rate of 0.02 U.S. perm. In some embodiments, the encapsulant-backsheet layer 18 includes a water vapor transmission rate of 0.01 U.S. perm.

It should be understood that the embodiments described herein are merely exemplary and that a person skilled in the art may make many variations and modifications without departing from the spirit and scope of the invention. All such variations and modifications are intended to be included within the scope of the invention.

What is claimed is:

1. A system, comprising:
   a plurality photovoltaic modules installed on a roof deck,
      wherein each of the plurality of photovoltaic modules includes
      at least one solar cell, wherein the at least one solar cell includes a first side and a second side opposite the first side,
      an encapsulant layer contacting the first side of the at least one solar cell,
      a glass layer juxtaposed with the encapsulant layer,
      and a encapsulant-backsheet layer contacting the second side of the at least one solar cell,
         wherein the encapsulant layer and the encapsulant-backsheet layer encapsulate the at least one solar cell; and
   an underlayment layer installed on the roof deck,
      wherein the underlayment layer is separate from each of the plurality of photovoltaic modules,
      wherein the plurality of photovoltaic modules are over the underlayment layer, and
      wherein the system does not include an intervening layer between the encapsulant-backsheet layer and the underlayment layer.

2. The system of claim 1, wherein the encapsulant-backsheet layer is composed of a thermoplastic polymer.

3. The system of claim 2, wherein the encapsulant-backsheet layer is composed of thermoplastic polyolefin (TPO).

4. The system of claim 3, wherein the thermoplastic polyolefin is selected from the group consisting of polyethylene, polypropylene, any copolymer thereof, any homopolymer thereof, any polymer blend thereof, or any combination thereof.

5. The system of claim 3, wherein the thermoplastic polyolefin is selected from the group consisting of a copolymer of propylene and ethylene, a blend of propylene and ethylene, a copolymer of ethylene alpha-olefin, a propylene homopolymer, an ethylene homopolymer, a propylene block copolymer, an ethylene block copolymer, a propylene elastomer, an ethylene elastomer, or any combination thereof.

6. The system of claim 2, wherein the thermoplastic polymer is selected from the group consisting of a copolymer comprising ethylene and octene, a copolymer comprising ethylene and hexane, a copolymer comprising ethylene and butene, polyethylene, polypropylenes, amorphous poly-alpha olefins (APAO), amorphous polyolefins (APO), or any combination thereof.

7. The system of claim 1, wherein a thickness of the encapsulant layer is 0.2 mm to 2 mm.

8. The system of claim 1, wherein the glass layer includes a thickness in a range of 2.5 mm to 4 mm.

9. The system of claim 1, wherein the encapsulant layer is made from a material selected from the group consisting of polyolefins, ethyl vinyl acetates, ionomers, silicones, poly vinyl butyral, epoxies, polyurethanes, and hybrids of any of same.

10. The system of claim 1, wherein the encapsulant layer encapsulates 50% to 99.9% of an exterior surface area of the at least one solar cell.

11. The system of claim 1, wherein the encapsulant-backsheet layer encapsulates 50% to 99.9% of an exterior surface area of the at least one solar cell.

12. The system of claim 1, wherein the encapsulant-backsheet layer is composed of a single extruded, two ply material having a first ply and a second ply.

13. The system of claim 12, wherein the first ply is thermoplastic polyolefin (TPO).

14. The system of claim 13, wherein the second ply is thermoplastic polyolefin (TPO).

15. The system of claim 1, wherein the encapsulant-backsheet layer is co-extruded.

16. The system of claim 1, wherein the encapsulant-backsheet layer includes a first material and a second material.

17. The system of claim 16, wherein the first material is thermoplastic polyolefin (TPO).

18. The system of claim 17, wherein the second material is thermoplastic polyolefin (TPO).

19. The system of claim 1, wherein the encapsulant-backsheet layer has a thickness of 0.2 mm to 4 mm.

20. A photovoltaic module, comprising:
    at least one solar cell, wherein the at least one solar cell includes a first side and a second side opposite the first side;
    an encapsulant layer contacting the first side of the at least one solar cell;
    a glass layer juxtaposed with the encapsulant layer; and
    an encapsulant-backsheet layer contacting the second side of the at least one solar cell,
        wherein the encapsulant layer and the encapsulant-backsheet layer encapsulate the at least one solar cell, and
    wherein the photovoltaic module is configured to be installed on a roof deck having an underlayment layer,
    wherein the underlayment layer is separate from the photovoltaic module, and
    wherein the encapsulant-backsheet layer is configured to be juxtaposed with the underlayment layer without any intervening layer between the encapsulant-backsheet layer and the underlayment layer.

* * * * *